United States Patent [19]

Kügler et al.

[11] Patent Number: 5,622,606
[45] Date of Patent: Apr. 22, 1997

[54] GAS INLET ARRANGEMENT

[75] Inventors: Eduard Kügler, Feldkirch-Tisis, Austria; Jakob Stock, Mastrils; Helmut Rudigier, Bad Ragaz, both of Switzerland

[73] Assignee: Balzers Aktiengesellschaft, Balzers, Liechtenstein

[21] Appl. No.: 230,292

[22] Filed: Apr. 20, 1994

[30] Foreign Application Priority Data

Apr. 22, 1993 [CH] Switzerland ............ 01240/93

[51] Int. Cl.$^6$ ..................... C23C 14/34
[52] U.S. Cl. ............... 204/192.12; 204/298.07; 204/298.03; 204/298.33
[58] Field of Search ........... 204/298.07, 192.12, 204/298.33, 192.13, 298.03

[56] References Cited

U.S. PATENT DOCUMENTS

| | | | |
|---|---|---|---|
| 3,854,443 | 12/1974 | Baerg | 118/49 |
| 4,172,021 | 10/1979 | Gladish | 204/298.07 X |
| 4,270,999 | 6/1981 | Hassan et al. | 204/298.33 X |
| 4,425,218 | 1/1984 | Robinson | 204/298.07 |
| 4,849,087 | 7/1989 | Meyer | 204/298.07 X |
| 4,871,434 | 10/1989 | Munz et al. | 204/298.07 X |
| 4,931,158 | 6/1990 | Bunshah et al. | 204/192.29 |
| 4,946,576 | 8/1990 | Dietrich et al. | 204/298.07 X |
| 5,087,341 | 2/1992 | Tsukada et al. | 204/298.33 X |
| 5,205,918 | 4/1993 | Kinokiri et al. | 204/298.07 |
| 5,223,111 | 6/1993 | Luef | 204/298.07 |
| 5,228,968 | 7/1993 | Zejda | 204/298.07 |

FOREIGN PATENT DOCUMENTS

| | | |
|---|---|---|
| 3331707 | 3/1985 | Germany . |
| 3527259 | 1/1986 | Germany . |
| 4120176 | 2/1992 | Germany . |
| 58-221276 | 1/1983 | Japan . |
| 58-30125 | 2/1983 | Japan . |
| 89010544 | 7/1987 | WIPO . |

OTHER PUBLICATIONS

Search Report for Swiss 01240/93.

*Primary Examiner*—Nam Nguyen
*Attorney, Agent, or Firm*—Notaro & Michalos P.C.

[57] ABSTRACT

At least one gas inlet arrangement with several gas outlet openings supplies a working gas and/or a reactive gas to a chamber through a line system with at least one gas source, and at a given gas pressure. The chamber is provided for the treatment of substrates, such as, in particular, by physical or chemical coating processes or by etching processes. The resistance coefficients of the outlet openings are so dimensioned with respect to the sites in the line system at the given gas pressure, that at each outlet opening, a controlled gas flow exits.

15 Claims, 3 Drawing Sheets

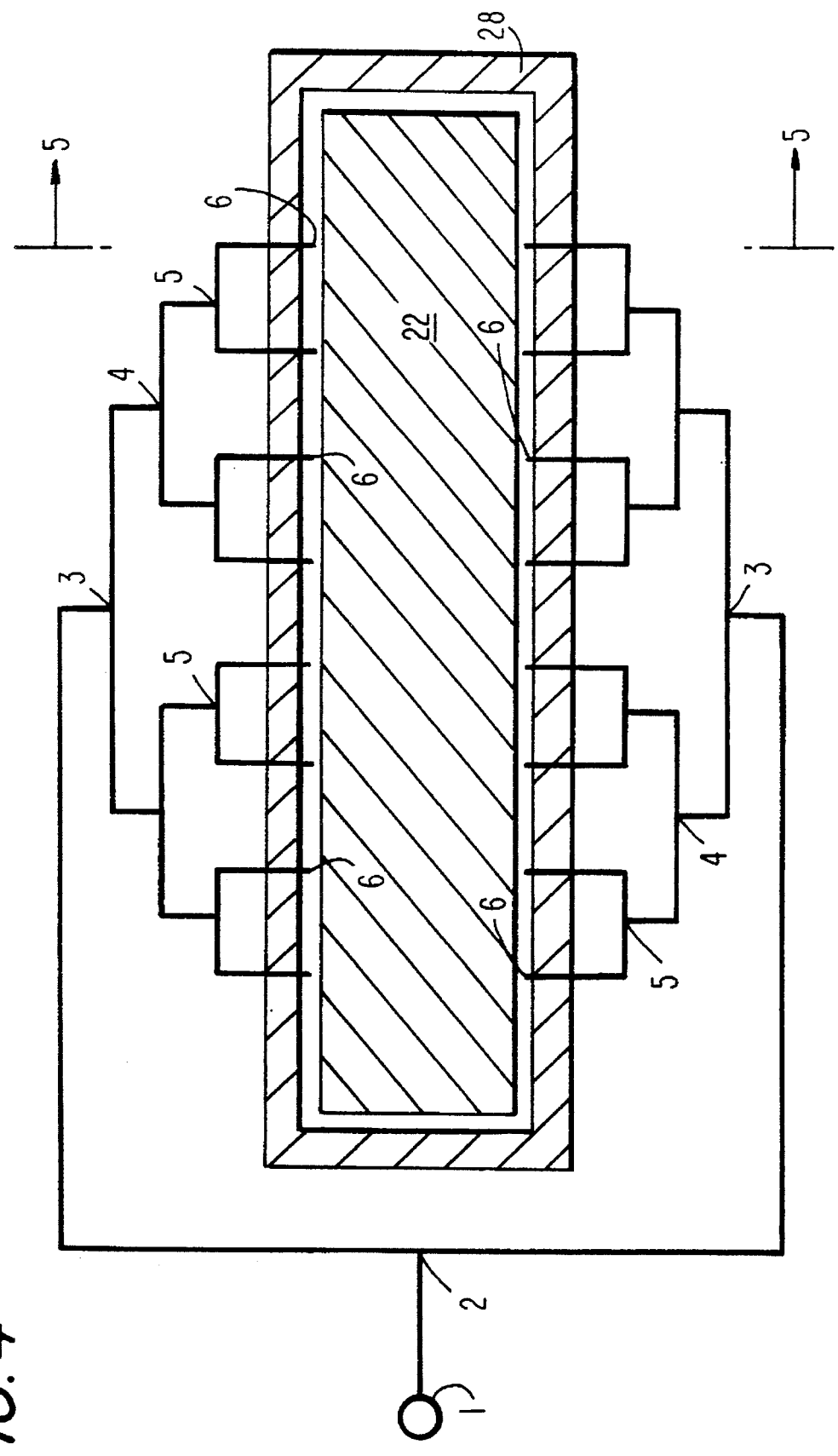

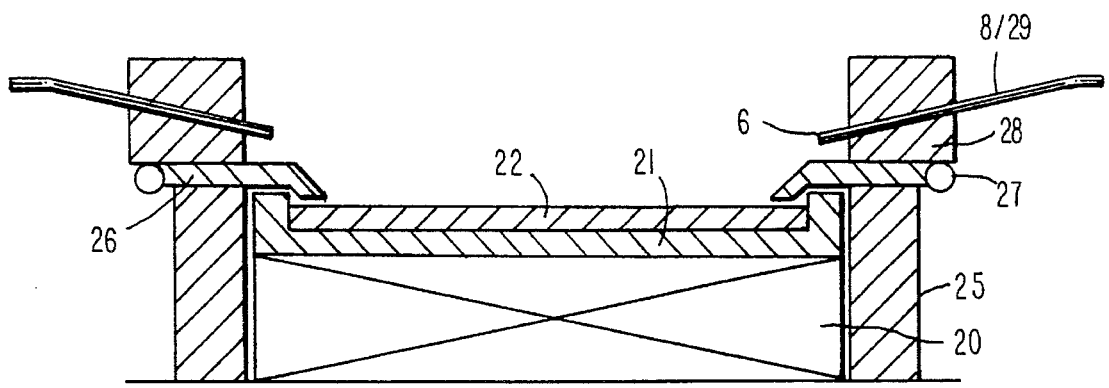
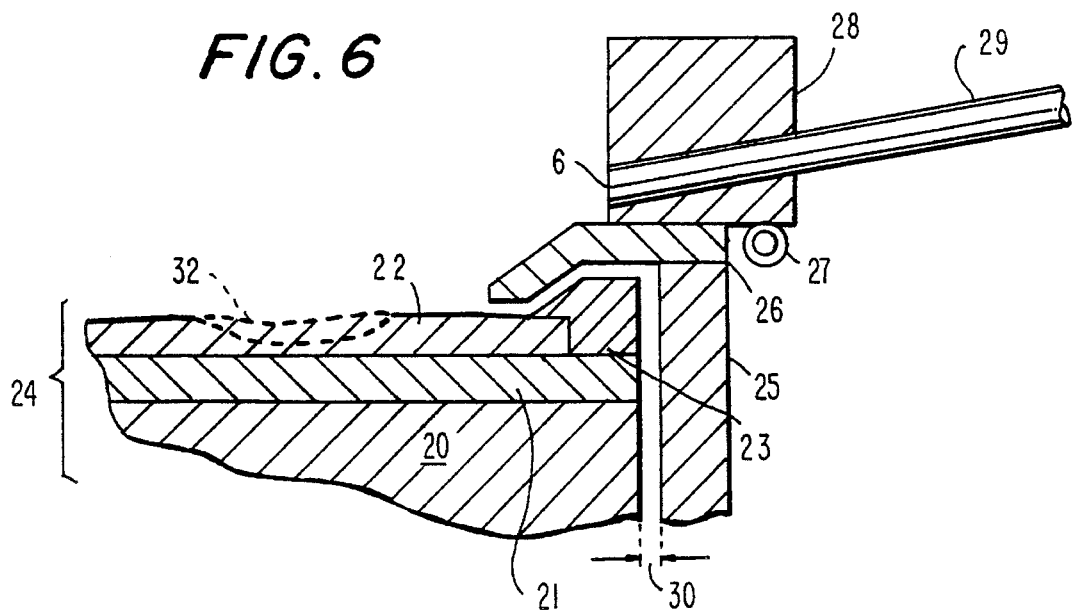

GAS INLET ARRANGEMENT

FIELD AND BACKGROUND OF THE INVENTION

The present invention relates to an arrangement for treating substrates in a vacuum receptacle, such as, in particular, by means of physical or chemical coating processes or by means of an etching process, an apparatus for sputtering or vaporization, a cathode sputtering apparatus with a target operated as a magnetron, as well as a process for the uniform treatment of substrates.

When treating substrates, such as, in particular, when coating for example in a high vacuum, it can be of the greatest importance that the treatment or the coating takes place so as to be distributed uniformly or homogeneously over the entire surface. Especially in cases in which work takes place by means of working gases or reactive gases, it has been found that the gas inlet system represents a sensitive component with respect to the above described conditions.

In particular in etching and coating technology utilizing so-called plasmas, such as for example with cathode sputtering in a receptacle, in the presence of non-homogeneous partial pressures of the working or reactive gases, inhomogeneous surfaces or layer distributions result on a substrate to be coated, with respect to layer thickness, or layer properties, such as index of refraction, coefficient of extinction, layer tension, composition, etc.

Diverse attempts are known for solving this set of problems. It is, for one, suggested to compensate, by means of so-called getter surfaces and diaphragms, different partial pressures and, on the other hand, to avoid the so-called "poisoning" of the target through the gas required at the substrate for the reactive deposition.

For example, in EP-A-0 347 567, use of a diaphragm with interspace between target and substrate is suggested, with the gases being supplied into this interspace.

In S. Manly et al., *J. Vac. Sci. Technol.*, 18(2), 195, 1981, it is suggested to dispose, between target and substrate, a shielding with a passage and to supply a reactive gas through a line system which encompasses this passage opening, with the outlet openings of this line system being directed toward the substrate.

In Schiller et al., *Thin Solid Films*, 64, 455, 1979, so-called getter surfaces are provided in the region of the target in order to prevent the "poisoning" of the target surface by the reactive gas which is introduced in the proximity of the substrate surface. These getter surfaces absorb the reactive gas, such as for example oxygen. In the proximity of the target surface, furthermore, an inert working gas is supplied in order to keep the reactive gas away from the target.

It is further suggested that a gas inlet arrangement comprise a buffer volume on which are provided several outlet openings, with the buffer volume being implemented so as to be significantly larger than the amplitudes of the conveying volume pulsations brought about by the gas inlet arrangement. As a rule, buffer volumes of this type are long buffer chambers with outlet openings disposed largely equidistantly in the longitudinal direction. The problem with buffer chambers of this type, also referred to as pipe gas showers, resides in that it is hardly possible to control the gas passage in all outlet openings since it is strongly dependent on the type of flow in the buffer chamber. It is indeed possible to dispose diaphragms or other flow impedances, in buffer chambers of this type, however, computations of such constructions is extremely complicated.

DE-OS-33 31 707 also described specific measures which are directed toward decoupling the effect of the reactive gas on the target or the substrate.

Lastly, in U.S. Pat. No. 4,931,158 a second discharge (auxiliary plasma) is even suggested in the proximity of the substrate. Again, a working gas is introduced near the target and a reactive gas is introduced near the substrate. The two plasmas are separated by means of a grid.

It is a disadvantage in all of these measures, that the coating rates are relatively low and, in addition, the danger of locally differing gas compositions or locally differing gas flows still exists and, consequently, the initially required homogeneity, for example of a coating, is still not ensured. Due to different gas compositions or different partial presses of the gas, moreover, small arc discharges can occur on the target.

SUMMARY OF THE INVENTION

It is a task of the present invention to ensure a reproducible homogeneous gas distribution along a target or along a substrate in order to ensure the desired homogeneity in the treatment of a substrate, on the one hand, and maximum high economy of the treatment process, on the other.

It is suggested that for treating substrates in a chamber, such as in particular by means of physical or chemical coating processes or by means of etching processes, with at least one target comprising a surface with material to be sputtered or to be vaporized, a gas inlet arrangement is to be provided with several gas outlet openings into the chamber for the inlet of a working gas and/or a gas reactively taking part in the treatment, which openings are connected through a line system with at least one gas source at a given gas pressure. It is essential that the resistance coefficients of the outlet openings with respect to the sites in the line system at the given gas pressure, are dimensioned so that at each outlet opening, a controlled gas flow occurs, into the chamber.

Due to this controllable gas flow at each site of the line system, it is possible to influence the gas distribution in the chamber and to implant it, as required, to be as homogeneous as possible.

By means of the solution suggested according to the invention, it becomes possible to introduce a reactive gas precisely apportioned and/or distributed on the target and specifically in the immediate proximity of the target while, in contrast, the teaching according to prior art teaches keeping the reactive gases away from the target.

For one, it is advantageous if the outlet openings of the gas inlet arrangement, with respect to at least one target or one material source and/or one or several substrates, to be disposed so as to be largely uniformly distributed. This prevents the generation of a locally increased concentration of the supplied gas.

For another, it is advantageous if the line system is laid out in such a way, or the resistance coefficients of the discrete outlet openings are at least nearly identical, so that through each outlet opening per unit time, at least nearly an identical quantity of gas exits into the chamber. This measure also leads, in the final analysis, to the fact that in the chamber, be that in the proximity of the target or be that at one or several substrates, maximum uniform gas distribution is ensured.

In order for the discrete resistance coefficients of the particular outlet openings to be, at least nearly identical, it is suggested according to an embodiment that the individual path lengths from the gas source to the outlet openings are essentially of identical length, and the cross sectional areas of the discrete outlet openings are implemented so as to be essentially of equal size. In order to fulfill this requirement, it is for example possible that, from the gas source to each gas outlet opening, a separate transporting line is disposed with essentially identical diameter and identical path length.

But it is also possible that the connection from the gas source to the gas outlet openings is implemented analogously to the system of a so-called binary tree in that, from the gas source, or from each bifurcation in the line system, two equidistant succeeding or following bifurcations are fed which, in turn, if necessary, feed two succeeding bifurcations, or potentially, two outlet openings.

In principle, the invention teaches that the gas inlet into a vacuum chamber is settable or reproducibly settable through the length of the feed line or through the cross section of the output opening or by means of both measures.

If several gases are to be introduced into the chamber, such as for example, on the one hand, in the proximity of the target and, on the other hand, in the proximity of one or several substrates, it is advantageous to dispose, for each working or reactive gas each, one gas inlet arrangement with respect to the target and the substrate(s), with the particular gas inlet arrangements, as described above, being implemented according to the invention.

The above arrangement or gas inlet arrangement, defined according to the invention, is especially suitable for an apparatus for sputtering or vaporizing with at least one target comprising a surface with material to be vaporized or sputtered.

As an example of such an apparatus is mentioned a cathode sputtering apparatus with a target operated as a magnetron and a gas inlet arrangement encompassing, at least partially, or bordering the cathode, or the magnetron and the outlet openings preferably being disposed largely uniformly with respect to the magnetron. According to a preferred embodiment of a cathode sputtering apparatus of this type, it is suggested that the gas inlet arrangement is integrated in an anode frame of the magnetron encompassing the cathode and, consequently, is itself a portion of the anode. In this way the discharge can be specifically drawn to the outlet openings in order to obtain efficient excitation of the reactive gas.

According to a further embodiment, it is possible to operate the gas inlet arrangement so as to be electrically insulated or also to connect it to a potential or to ground potential, for forming a further discharge circuit.

According to a preferred embodiment of a cathode sputtering apparatus according to the invention, the magnetron is formed by the target, an anode frame and the gas outlet openings disposed integrally in the anode frame, which anode frame is preferably water-cooled and potentially is implemented so as to be pulled over the target edge so far that the outlet openings are directed toward the erosion trench of the target, with the dark field space being preferably implemented so as to be identical everywhere.

It is understood that, in addition to the gas inlet arrangement disposed integrally in an anode frame, it is possible to provide further gas inlet arrangements which are provided, for example, for the introduction of a reactive gas in the region of the substrate(s) to be treated or coated. However, it is not absolutely necessary that the gas inlet arrangement is disposed integrally in the anode frame, but it can also be integrated in any frame, independently of the anode frame.

Lastly, a process is suggested for the uniform treatment of substrates in a chamber, such as in particular, by means of physical or chemical coating processes, such as for example sputtering processes or by means of etching processes in which, via a gas inlet arrangement with several outlet openings from at least one gas source at a given gas pressure, at least one working and/or one gas reactively taking part in the treatment, is introduced into the chamber, with the gas flow exiting at each outlet opening taking place so as to be controlled. The resistance coefficients of the discrete outlet openings with respect to the sites in the line system at the given gas pressure, are dimensioned according to the required gas flow. At each outlet opening per unit time, preferably the same quantity of gas is introduced into the chamber.

It is understood that the above described arrangements, apparatuses as well as processes according to the invention, are not limited to the cathode sputtering apparatus with a magnetron, listed by example, but rather can be applied in any treatment or coating apparatus and arrangements in which the uniform treatment or coating of a substrate is required. It is therein insignificant whether or not, in the chamber, the operation is carried out at normal working pressure, or reduced pressure, such as high vacuum or ultrahigh vacuum. The gas inlet arrangements defined according to the invention and the corresponding process, are also suitable for the introduction of any working or reactive gases into a chamber.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

BRIEF DESCRIPTION OF THE DRAWINGS

The invention will be explained in further detail by example and with reference to the enclosed drawings, wherein:

FIG. 4 is a sectional view of a cathode sputtering apparatus with a magnetron and a gas inlet arrangement such as for example, depicted in FIG. 2;

FIG. 5 is a cross sectional view of, the target and an anode frame of a cathode spattering apparatus that is analogous to the one depicted schematically in FIG. 4 taken along line 5—5 of FIG. 4; and FIG. 6 is a detail sketch, in section, of a preferred embodiment of an anode frame with a gas outlet opening, such as to be used for example in the arrangement according to FIG. 5.

DESCRIPTION OF THE PREFERRED EMBODIMENTS

Figure 1:
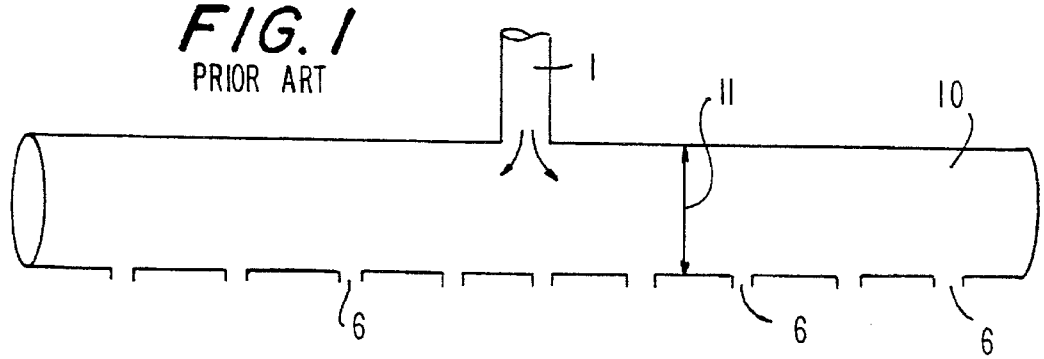
FIG. 1 is a schematic view of a gas inlet arrangement according to prior art comprising a so-called buffer chamber or gas pipe shower.

FIG. 1 depicts a gas inlet arrangement as known from prior art, in which, preceding the discrete outlet openings 6, a buffer chamber 10 is disposed. Along this buffer chamber 10 are disposed discrete outlet openings extending in the longitudinal direction and preferably equidistant with respect to one another. The greater the cross sectional area 11 of the buffer chamber 10, the better it is ensured that the resistance coefficient of the discrete outlet openings 6 is identical or that through the discrete outlet openings, an identical quantity of gas flows. However, it has been found in practice, that for the penetration of identical quantities of gas, relatively large cross sections of buffer chambers or gas pipe showers must be selected. Moreover, the functioning of a gas pipe shower of this type depends strongly on the selected total gas throughflow quantity, and on the type of flow, so that at one selected throughflow quantity, it may very well be possible to achieve a uniform distribution, while subsequently at another total throughflow quantity, the distribution is no longer uniform. It would indeed be possible to dispose, in the buffer chamber, deflection diaphragms or resistance elements, however, the computations for construction of this type are complicated, and it is even then not ensured that in the entire buffer chamber the flow is always of the same type.

For this reason, simpler alternatives are suggested according to the invention, such as are depicted in the figures described in the following.

Figure 2:
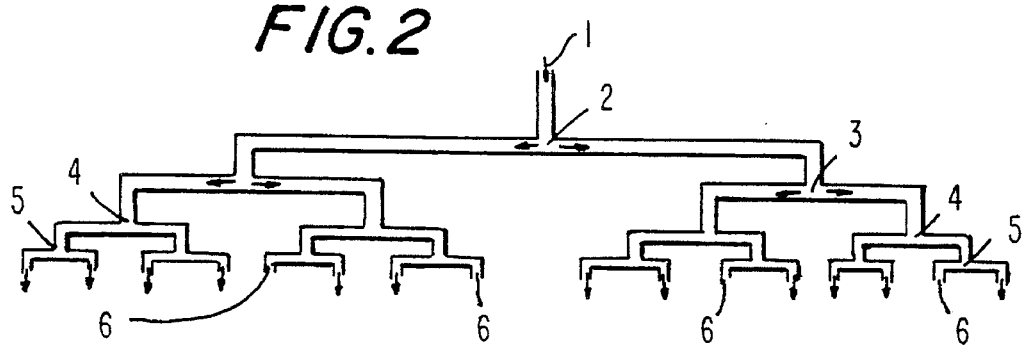
FIG. 2 is a view similar to FIG. 1 of a gas inlet arrangement according to the invention implemented as a so-called binary tree.

FIG. 2 schematically depicts a gas inlet arrangement for the introduction of a working or reactive gas into a chamber. From a gas source 1 a line leads to a first bifurcation 2. Equidistant to this bifurcation, two bifurcations 3 are fed over two identically dimensioned lines. From these bifurcations 3, again over lines of equal length and equal dimensions, further third bifurcations 4 are fed. Lastly, from further fourth bifurcations 5, in each instance two outlet openings 6 are each fed. Through this construction of the gas inlet system it is ensured that every outlet opening 6 has the same resistance coefficient and that consequently, through each outlet opening 6 per unit time, the same quantity of gas is output into the chamber. It is understood that it is possible to implement branches in further planes wherein the bifurcations or the number of outlet openings should be selected on the basis of the size of the target, or of the substrate to which the gas to be introduced is to be output.

Through the gas inlet arrangement depicted in FIG. 2 it is possible to achieve a homogeneous gas distribution over a substrate or a target. Due to this a homogeneous reaction rate is obtained, for example. With this arrangement, the required homogeneous layer properties, such as stated above, can be achieved over a desired region or over the entire substrate to be treated or to be coated.

Figure 3:
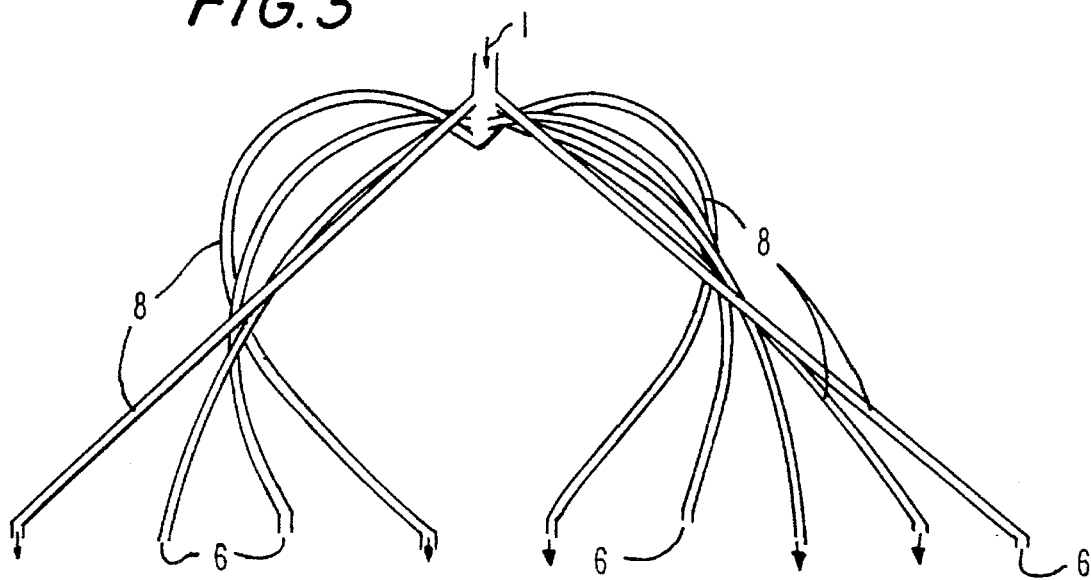
FIG. 3 is a view similar to FIG. 1 of a further embodiment of a gas inlet arrangement of the invention.

A further embodiment of an inlet arrangement according to the invention is depicted schematically in FIG. 3. From a gas source 1, over transport lines 8 of equal length and equal dimensions, the particular terminally disposed gas outlet openings 6 are fed. These gas outlet openings 6 are, to the largest possible extent, dimensioned identically i.e. the cross sectional area of each outlet opening is of identical dimension. Through this implementation of the gas inlet system it is, in turn, ensured that the resistance coefficients of the discrete gas outlet openings are identical and consequently, per unit time, the identical quantity of gas is output into the chamber.

In the representation according to FIGS. 2 and 3, in each instance, lines of identical length results, and with identical diameter of the outlet openings, the gas flow in each outlet openings is also identical. By varying the diameter or the cross sectional area of the outlet openings, it is now possible, with feed lines of identical length and identical cross sections of the lines, to specifically and reproducibly control the gas flow in each outlet opening. Analogously, it is conversely possible, with outlet openings of identical size, to reproducibly control, in turn, the gas flow, by varying the length or the cross section of the feed lines. A specific reproducible setting of the gas flow is hardly possible in the case, for example, of a gas pipe shower, such as is depicted in FIG. 1.

In FIG. 4, a gas inlet arrangement such as, for example in FIG. 2, is depicted schematically, disposed on a target or on a magnetron of a cathode sputtering apparatus. At both sides of the longitudinal extent of a magnetron comprising a target 22 and a, for example, water-cooled anode frame 28, encompassing the target on all sides, gas outlet openings 6 are disposed so as to be directed toward the target 22. These gas outlet openings 6 are fed by a line system starting at a gas source 1, which, in turn, feeds bifurcations 2, which subsequently, in turn, feed bifurcations 3 or 4. It is clearly apparent in FIG. 4 that the line system is structured analogously to FIG. 1 according to a binary tree, in that from the gas source 1 or the bifurcations 2, 3, and 4, further bifurcations or the gas outlet openings 6 are fed, which are disposed equidistantly from the corresponding bifurcation. It is thereby ensured that, from the gas source 1 to each gas outlet opening 6 the same length of path in the line system must be travelled. It is of advantage that in this arrangement, the effectiveness of the gas(es) introduced is always identical, independently of the type of flow or the flow region.

Provided that the cross section of the line is identical everywhere, and also the opening cross section of each outlet opening 6 is of identical size, consequently, in turn, the resistance coefficients of all outlet openings 6 are identical, which means that at each gas outlet opening per unit time, independently of the type of flow, the same quantity of gas is output toward the target 22. The gas to be output can be either a working gas, such as an inert noble gas, such as for example argon, or a reactive gas, such as for example nitrogen or oxygen, or a gas mixture, for example comprising an inert noble gas (Ar) and oxygen ($O_2$). The reactive gas reacts with the metal to be vaporized or to be sputtered and the corresponding nitrides or oxides can be produced for generating nitride or oxide layers on a substrate. The nitride or oxide formation can already take place on the target surface or after the vaporization of the metal. The discrete gas outlet openings 6 are disposed equidistantly, one from the other, in order to generate a uniform gas distribution over the target.

Analogous to the gas inlet arrangement depicted in FIG. 4, it is understood that a gas inlet arrangement can also be disposed, opposing a substrate, by structuring the system in the sense of a binary tree.

In FIG. 5 a target is depicted in cross section, as well as the anode frame of a magnetron encompassing the target, for example corresponding to a section along line 5—5 in FIG. 4. For the explanation of the arrangement according to FIG. 5, reference is made to FIG. 6 in which, in cross section, a section of a detail sketch of a portion of the anode frame is depicted, such as has been used in the arrangement according to FIG. 5. The section shows the site of the anode frame at which is disposed a gas pipe or an outlet opening 6.

The anode frame 28 of a magnetron is disposed laterally to the target 22, which target 22 is supported on a target cooling plate 21, which, in turn, is supported on a water cooling mechanism with magnet system 20. The arrangement depicted is a so-called magnetron such as is used, for example, in cathode sputtering apparatuses. The target 22 is lastly held laterally by means of a so-called target clamping ring 23, on the target cooling plate 21. Target 22, cooling plate 21, magnet system 20 and the target clamping ring 23 together form the cathode 24 of the magnetron depicted.

The anode disposed on the side of the cathode 24 comprises, on the one hand, the anode frame 28 through which extends a gas pipe 29, encompassing at the front face, the gas outlet opening 6. For cooling the anode frame 28, a water cooling mechanism 27 is provided, which cooling is especially important if the discharge is to be drawn onto the gas outlet opening in order to bring about, in this way, the efficient excitation of the reactive gas. This is achieved, in particular, if the gas pipe itself is a portion of the anode or if the gas outlet is not insulated relative to the anode. An integral arrangement of the gas outlet in the anode has positive effects on the quality of the layer, as well as also on the coating rate. It is, moreover, advantageous if the gas outlet openings are directed toward the erosion trench of the target, which is depicted schematically in FIG. 6, through the depression 32 in the surface of target 22.

The anode frame 28 is supported on an anode mounting plate 26, with which mounting plate the frame is fixedly connected, for example, with screws, which allows ready dismounting of the anode frame. The mounting plate 26 is, in turn, disposed on an anode base plate 25. It is understood that anode base plate 25, mounting plate 26 as well as anode frame 28 can also be produced integrally.

In the detail sketch depicted in FIG. 6, the anode mounting plate 26 is drawn in over the target clamping ring 23, over the target edge, in order in this way to be able to suppress effectively, spark-overs which are generated in the margin zones of the target. It is, of course, conceivable that the dark field space 30 is everywhere identical so that the plasma generated above the target is shielded effectively. This shielding of the plasma can, of course, be accomplished in many different ways, however, the implementation depicted by example in FIG. 6, has been found to be advantageous.

The applications depicted in FIGS. 4 to 6 of a gas inlet arrangement according to the invention are only embodiment examples serving for a more detailed explanation of the invention. It is, for example, also possible to dispose gas inlet lines independently of the anode frame, i.e. so as to be insulated from the anode frame in any frame encompassing the target. Furthermore, the gas inlet arrangement can be operated at ground potential or it can be connected to a separate potential.

It is understood that it is also possible to use the various described and claimed embodiments of gas inlet arrangements in all conceivable types of treatment or coating apparatuses in which the surface of a substrate is to be treated in a chamber. In particular, all possible embodiments of apparatuses such as are used for carrying out PVD and CVD processes are conceivable.

The implementation itself of the gas inlet arrangement defined according to the invention, is not limited to the examples in FIGS. 2 and 3, but comprises all gas inlet systems in apparatuses of this type, in which the gas inlet takes place in a controlled manner or in which, by means of a specific gas inlet, a preferably uniform gas distribution can be effected.

While a specific embodiment of the invention has been shown and described in detail to illustrate the application of the principles of the invention, it will be understood that the invention may be embodied otherwise without departing from such principles.

What is claimed is:

1. A cathode sputtering apparatus, comprising:
   a vacuum chamber for containing a substrate to be coated in a vacuum process;
   a target which is operated as a magnetron in the chamber, the target having a surface to be sputtered or vaporized for coating the substrate;
   a gas source at a selected gas pressure;
   a gas inlet connected to the gas source for receiving gas at the selected pressure;
   a line system connected to the gas inlet for receiving a plurality of flows of gas from the gas inlet;
   a plurality of gas outlet openings into the chamber for introducing gas from the line system into the chamber at a plurality of space locations along the target and toward the target surface, the gas outlet openings being connected to the line system for receiving the flows of gas; and
   means in the line system in the form of an arrangement and geometry of the line system, such that a connection between the gas inlet and each of the gas outlet openings has a defined flow resistance coefficient, the flow resistance coefficient of each of the gas outlet openings being equal.

2. An apparatus as stated in claim 1, wherein the line system is laid out in such a way that the resistance coefficients of the outlet openings have at least nearly identical values so that through each outlet opening in the line system per unit time, at least nearly the same quantity of gas exits into the chamber.

3. An apparatus as stated in claim 2, wherein the line system is layed out so that all individual path lengths between the gas source and each respective outlet opening, is substantially identical.

4. An apparatus as stated in claim 2, wherein the line system comprises a separate transporting line connected between the gas source and each respective one of the outlet openings, each of the transporting lines having substantially identical diameter and substantially identical path length.

5. An apparatus as stated in claim 1, wherein the connection from the gas source to the gas outlet openings is implemented as a binary tree having a plurality of bifurcations in the line system, and, from the gas source and equidistant from each bifurcation in the line system, two succeeding bifurcations are fed which, in turn, feed at least two succeeding bifurcations each, up to the outlet openings.

6. An apparatus as stated in claim 1, including a cathode at least partly bordering the magnetron.

7. An apparatus as stated in claim 1, including an anode frame, the line system being integrally positioned within the anode frame, the apparatus including a cathode and with line system encompassing the cathode.

8. An apparatus as stated in claim 7, including means for drawing an electrical discharge onto the outlet openings by connecting the line systen to an electrical potential so that the openings form a portion of an electrode and define a discharge gap with the magnetron.

9. An apparatus as stated in claim 8, wherein the line system is electrically insulated to form a second discharge circuit.

10. An apparatus as stated in claim 1, wherein the magnetron is formed by the target, an anode frame and the outlet openings being disposed integrally in the anode frame, the anode frame being water-cooled and implemented so as to be drawn in so far over a margin of the target in order to suppress spark-overs in the margin of the target, and the gas outlet openings are directed toward an erosion trench of the target.

11. An apparatus according to claim 10 wherein the line system comprises a binary tree having a plurality of bifurcations between the gas inlet and the plurality of gas outlet openings, the line system being structured so that from the gas inlet to the gas outlet openings, an equal distance is provided from each bifurcation and each bifurcation feeds two succeeding bifurcations up to the outlet openings.

12. An apparatus according to claim 10 wherein the line system comprises a separate transporting line between the gas inlet and each of the gas outlet openings, each transporting line having substantially identical diameter and substantially identical path length.

13. A process for uniformly treating a magnetron target of a cathode sputtering apparatus comprising:

providing a target having a surface with material to be sputtered or vaporized, in a vacuum chamber;

supplying a gas from a gas source at a selected gas pressure, to a gas inlet of a line system having a plurality of gas outlet openings;

directing the gas outlet openings for introducing gas into the chamber and toward the target surface at a plurality of space locations along the target;

establishing the arrangement and geometry of the line system such that the connection between the gas inlet and each of the gas outlet openings has a selected flow resistance coefficient, the flow resistance coefficients of the gas outlet openings being equal to each other.

14. A method according to claim 13 including forming the line system to have a geometry of a binary tree with a plurality of bifurcations, each bifurcation being equally distantly connected to subsequent bifurcations between the gas inlet and the plurality of gas outlet openings.

15. A method according to claim 13 including forming the line system to comprise a plurality of separate transporting lines each connected between the gas inlet and one of the gas outlet openings, all of the transporting lines having identical path length and diameter.

* * * * *